US006387753B1

(12) United States Patent
Clark

(10) Patent No.: US 6,387,753 B1
(45) Date of Patent: May 14, 2002

(54) LOW LOSS CAPACITOR STRUCTURE

(75) Inventor: Charles Francis Clark, Celina, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/697,819

(22) Filed: Oct. 26, 2000

Related U.S. Application Data

(62) Division of application No. 09/000,510, filed on Dec. 30, 1997, now Pat. No. 6,177,716.

(51) Int. Cl.[7] ............................................. H01L 21/8242
(52) U.S. Cl. ....................... 438/253; 438/396; 438/957
(58) Field of Search ................................. 438/253, 256, 438/239, 396, 957; 257/296, 303, 306, 532, 535; 361/303, 313, 322

(56) References Cited

U.S. PATENT DOCUMENTS

| 4,994,760 A | | 2/1991 | Roehrs ......................... 330/295 |
| 5,479,316 A | | 12/1995 | Smrtic et al. ............... 361/322 |
| 5,492,857 A | | 2/1996 | Reedy et al. .................. 437/63 |
| 5,541,442 A | | 7/1996 | Keil et al. .................... 257/533 |
| 5,591,663 A | * | 1/1997 | Nasu et al. ...................... 438/3 |
| 5,635,421 A | * | 6/1997 | Ting ............................. 438/396 |
| 5,739,566 A | | 4/1998 | Ota .............................. 257/315 |
| 5,767,757 A | | 6/1998 | Prentice ....................... 333/172 |
| 5,801,411 A | | 9/1998 | Klughart ...................... 257/296 |

FOREIGN PATENT DOCUMENTS

| JP | 405343616 A | * | 12/1993 |
| JP | 406244133 A | * | 9/1994 |
| JP | 407226443 A | * | 8/1995 |
| JP | 407235639 A | * | 9/1995 |

* cited by examiner

*Primary Examiner*—Olik Chaudhuri
*Assistant Examiner*—Hoai Pham
(74) *Attorney, Agent, or Firm*—Dwight N. Holmbo; Wade James Brady, III; Frederick J. Telecky, Jr.

(57) ABSTRACT

A capacitor structure (100) including first and second capacitor plates (102, 106) insulatingly spaced from each other by a capacitor dielectric (102). A first set of conductive posts (301) electrically couple to the first capacitor plate (102) and extend away from the capacitor dielectric (104). A first conductive structure (302) comprising a material with lower resistivity than the first capacitor plate (102) is electrically coupled to the first set of conductive posts (301). In a preferred embodiment, a second set of conductive posts (501) are electrically coupled to the second capacitor plate (106) and extend away from the capacitor dielectric (102). A second conductive structure (503) is electrically coupled to the second set of conductive posts (501).

5 Claims, 2 Drawing Sheets

LOW LOSS CAPACITOR STRUCTURE

This is Divisional application of Ser. No. 09/000,510, filed Dec. 30, 1997 now U.S. Pat. No. 6,177,716.

BACKGROUND OF THE INVENTION

1. Field of the Invention

The present invention relates, in general, to capacitor structures, and, more particularly, to capacitor structures for semiconductor devices and integrated circuits.

2. Relevant Background

High frequency and radio frequency (RF) systems and devices play an increasingly important role in data storage and data communication. These systems use high frequency and RF integrated circuits (ICs) that must switch signals and power at relatively high frequencies. The present invention has great utility in radio frequency switching circuits, however, the term "RF" is used herein to refer to systems, devices, and device structures that operate at high frequencies (i.e., greater than about 10 kilo-hertz) which includes some frequencies below and above what is conventionally described as radio frequency.

Circuits that process RF signals must provide impedance transformation from the typically low terminal impedance of transistors to different impedance antennas or other active devices. Impedance transformation may be accomplished using inductor-capacitor transformation networks. RF ICs require low loss inductors and capacitors to function efficiently. Lossy inductors and capacitors dissipate energy as heat that must be removed from the IC package. Heat removal limits device performance and functionality and makes the IC larger and thus more expensive, as well as making the packaging more expensive.

As a result of the low Q components available in existing integrated circuit structures, impedance transformation ability of monolithic integrated circuits is limited. Losses in capacitors and inductors limit the impedance transformation of each transformation network stage. The transformation Q cannot exceed the loaded Q without the losses becoming excessive. The transformation Q is often referred to as the loaded Q or $Q_l$. The unloaded Q (i.e., $Q_u$) represents the component losses.

A typical input impedance' for a two watt power MOSFET at 900 MHz is (4–21.4j) ohms. This input impedance needs to be transformed to approximately 20.2 Ohms which is the load required by a preceding stage driving the MOSFET. A single L-section with an inductor Q of 5 will cause a 3 dB insertion loss.

Attempts have been made to improve the system Q by improving the inductor Q. Microstrip inductors can have the metallization series resistance decreased by connecting additional layers of metal. The loss limiting mechanism for transformation networks soon becomes the parasitic capacitor coupling into the low resistance substrate. This limits the practical Q to a range of about 5 to 10 for monolithic inductive elements. The Q can be raised by decreasing the parasitic capacitance of the inductor with additional layers of dielectric, which adds cost and lowers yields. Hence, improvement of the capacitor Q is a desirable way to improve overall Q of the transformation network.

In the past, the low per-stage impedance transformation ability was addressed by using a greater number of impedance transformation stages. However, a greater number of impedance transformation stages increases the number of components and the size of the integrated circuit. Because fewer integrated circuits can be placed on a single wafer or substrate, the integrated circuit cost increases. By reducing the losses in the capacitor circuits of an integrated circuit, the number of active stages required decreases and the space efficiency of the overall layout increases. Efficiency of RF power amplifiers is a major advantage in the cellular and personal communication systems marketplace.

In addition to high Q, integrated capacitors are desirably volumetrically efficient. In other words, the capacitor structure should have a high capacitance per unit volume ratio. One prior method of increasing the capacitance per unit volume in an integrated circuit is to use thinner capacitor dielectric layers between the capacitor plates. Capacitor plates can be spaced closely together using thin film conductors such as polycrystalline silicon (e.g., polysilicon, doped polysilicon, and polysilicon silicide) separated by thin film dielectrics such as silicon dioxide. However, conductors such as polysilicon silicide, also called "polycide", have high sheet resistance as compared to metals in the range of four Ohms per square and thus increase the RC time constant for a capacitor element.

Conductor plates comprising materials with lower resistivities such as metals, which are desirable from a high Q standpoint, are not compatible with the temperatures and processes involved to form the thin dielectric layers in an integrated circuit. With low resistivity metal capacitor plates, the relatively thick capacitor dielectrics severely reduce capacitance per unit area for an integrated circuit. It is advantageous to provide an integrated circuit construction method and structure that provide low loss, compact capacitors capable of being monolithically integrated in radio frequency power amplifiers.

Another prior method for improving capacitance density is to provide a capacitor structure comprising lossy plates having a high resistivity material surrounded by low resistivity material at the periphery. For small area capacitors, this type of structure works well but the reduction in resistance diminishes quickly for larger capacitor structures. For example, if a rectangular capacitor structure is extended in one direction beyond one square, the resistance does not drop appreciably. If the rectangular capacitor is extended in the opposite direction, the resistance will drop, but the form factor of the capacitor is poor making it more difficult to integrate with other components. What is needed is a capacitor structure with a highly adaptable form factor yet providing low resistance and high capacitance per unit volume for large capacitor structures.

SUMMARY OF THE INVENTION

Briefly stated, the present invention involves a capacitor structure including first and second capacitor plates insulatingly spaced from each other by a capacitor dielectric. A first set of conductive posts electrically couple to the first capacitor plate and extend away from the capacitor dielectric. A first conductive structure comprising a material with lower resistivity than the first capacitor plate is electrically coupled to the first set of conductive posts. In a preferred embodiment, a second set of conductive posts are electrically coupled to the second capacitor plate and extend away from the capacitor dielectric. A second conductive structure is electrically coupled to the second set of conductive posts. The first and second conductive structures provide low resistance contacts to the capacitor.

In another aspect, the present invention involves a method for forming a capacitor on a supporting substrate by forming a first capacitor plate on the substrate. A capacitor dielectric is formed over the first capacitor plate with a second capacitor plate formed over the first capacitor plate and separated from the first capacitor plate by the capacitor dielectric. The second capacitor plate is covered by a first dielectric. A first set of vias is formed in the first dielectric that extend through the second capacitor plate to expose portions of the first capacitor plate. Each of the first set of vias is filled with conductive posts that electrically couple to the first capacitor plate. A patterned metallization is provided to electrically couple the conductive posts to form a low resistivity coupling to the first capacitor plate. In a preferred embodiment, the patterned metallization is covered with a second dielectric and a second set of vias is formed through the second dielectric to expose portions of the second capacitor plate. Each of the second set of vias is filled with conductive posts extending through the second dielectric and electrically coupling to the second capacitor plate. A patterned metallization electrically coupling the conductive posts in the second dielectric is provided to form a low resistivity coupling to the second capacitor plate.

DETAILED DESCRIPTION OF THE PREFERRED EMBODIMENTS

Figure 1A:
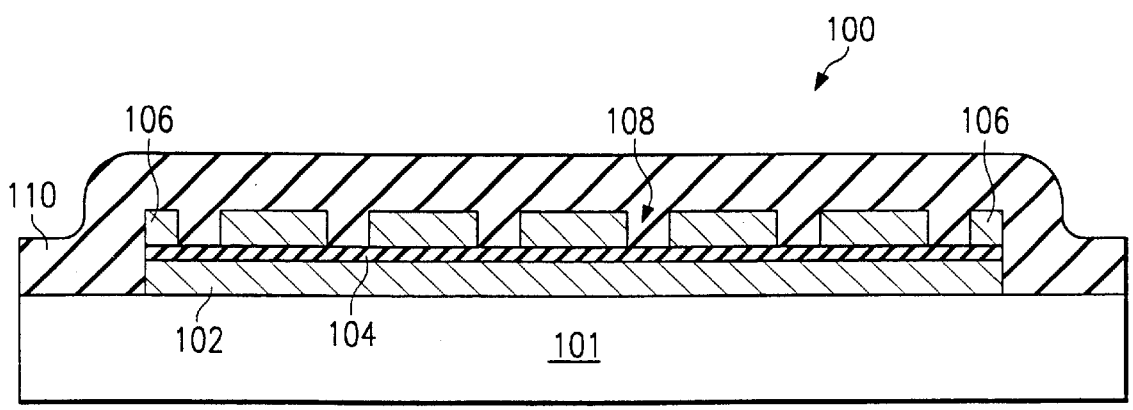
FIG. 1A illustrates in cross section a capacitor structure in accordance with the present invention at an early stage of processing.

The present invention relates to a capacitor structure that is preferably used in a monolithic integrated circuit (IC) such as a radio frequency (RF) power amplifier. It should be understood, however, that capacitors have a large number of applications and the capacitor structure in accordance with the present invention is useful in any application in which conventional capacitor structure could be applied. The capacitor structure in accordance with the present invention may be implemented as a discrete device or as a monolithic integrated circuit. The capacitor structure is described herein in terms of specific materials and thicknesses, however, it should be understood that the teachings in accordance with the present invention can be adapted to the limitations and capabilities of any semiconductor processing technology.

Both inductor and capacitor quality factors, commonly referred to as Q's, have a significant effect on interstage matching losses in high frequency amplifiers. It is often assumed that capacitor Q's are always greater than the inductors that are used with them. While this is generally true, in monolithic power amplifiers the low Q of both of these components often affects gain and power efficiency. One feature of the structure in accordance with the present invention is an improvement of the capacitor Q in a volumetrically efficient structure.

In monolithically integrated capacitors, the series resistance of the plates is significant. To get good volumetric efficiency (i.e., high capacitance per unit area) the capacitor dielectric separating the plates should be a thin (e.g., 0.02 to 0.1 micrometers) oxide or other dielectric with a high dielectric constant. Typical materials used to form the capacitor plates around the capacitor dielectric are polysilicon, doped polysilicon, or silicided polysilicon.

In multi-layered metal (MLM) monolithic integrated circuits there are also one or more metal layers each separated by an interlayer dielectric (ILD) used to form patterned interconnect wiring for the integrated circuit. Because of the much greater thickness (e.g., 0.5 to 1.0 micrometers) the ILD separating multiple metal layers, capacitors formed from the metal layers are usually volumetrically inefficient.

Silicided polysilicon used to make the capacitor plates has a typical resistivity of four Ohms per square. In contrast, the overlying metal layers have a resisitivity of less than 0.1 Ohm per square. A square capacitor will have a significant series resistance due to the four Ohm per square plate resisitivity regardless of its capacitance. To approach one Ohm of series resistance, for example, the aspect ratio will need to approach 4:1. The aspect ratio is the ratio of the width of the capacitor to the length so that the width to which contact would be made must be four times longer than the length to reduce the four Ohm per square resistance to a one-quarter square resistor. A one Ohm resistance gives, for example, a Q of only ten for such a capacitor. (i.e., 17.7 pf @ 900 MHz)

The preferred embodiments are described in terms of a monolithic integrated circuit formed on a silicon substrate, however, any semiconductor processing technology including gallium arsenide, III-V, II-VI, silicon on insulator (SOI) or other available semiconductor technology may be used to implement the capacitor structure in accordance with the present invention. These and other modifications of the specific teachings are considered equivalent to the specific embodiments disclosed herein.

FIG. 1A–FIG. 5 illustrate a capacitor structure in accordance with the present invention at various stages of processing. Substrate 101 serves to support capacitor structure 100 and may comprise semiconducting, semi-insulating or an insulating material that provides mechanical support and isolates or selectively couples one plate of capacitor structure 100 to other circuitry (not shown) formed on the remainder of the integrated circuit. Capacitor structure 100 includes a lower plate 102 comprising, in a preferred embodiment, polysilicon, doped polysilicon, polycide or polysilicide such as tungsten-silicide. Polycide capacitor plates are used in the preferred implementation to provide minimum resistance capacitor plates.

Lower capacitor plate 102 is patterned in any convenient shape to define the form factor of the capacitor structure 100 and is typically square or rectangular in shape. In accordance with the preferred embodiment, lower plate 102 is solid and has a typical resistivity of approximately four Ohms per square.

A thin capacitor dielectric 104 is formed by deposition or thermal oxidation of the upper surface of lower plate 102 to a thickness of, for example, 300 angstroms (0.03 micron). Capacitor dielectric 104 is typically formed as a continuous layer covering capacitor plate 102 and may be formed before the patterning of capacitor plate 102 such that capacitor dielectric and capacitor plate 102 are patterned together using a single mask and etch process.

Upper capacitor plate 106 is formed over capacitor dielectric 104 and would conveniently comprise the same material as lower capacitor plate 102. Chemical vapor deposition (CVD) including low pressure and plasma enhanced CVD are suitable techniques for forming lower capacitor plate 102 and upper capacitor plate 106. Unlike lower capacitor plate 102, upper capacitor plate 106 is preferably patterned either during formation or after formation by photolithography to expose a number of openings 108 over lower capacitor plate 102 in which the conductive posts 301 (shown in FIG. 3) will be formed. Alternatively, upper capacitor plate 106 can be formed and patterned with the same mask as capacitor plate 104 and lower plate 102 and subsequently etched to provide openings 108 for posts 301, however, this process would require oxidation or spacer formation on the edges of the openings 108 in upper capacitor plate 106 to provide adequate isolation.

Upper capacitor plate 106 is covered a first interlayer dielectric 110 using conventional CVD or plasma enhanced CVD processing. In the particular example at FIG. 1A, interlayer dielectric 110 comprises a deposited oxide using a tetraethyloxysilane (TEOS) process, but any convenient interlayer dielectric may be used including TEOS, boron- or phosphorous- doped glass, spin-on glass or a polymer depending upon what materials are available. In the particular example, cavities 108 are filled with the ILD 110 and ILD 110 is subsequently planarized to provide a level upper surface for future processing.

Figure 1B:
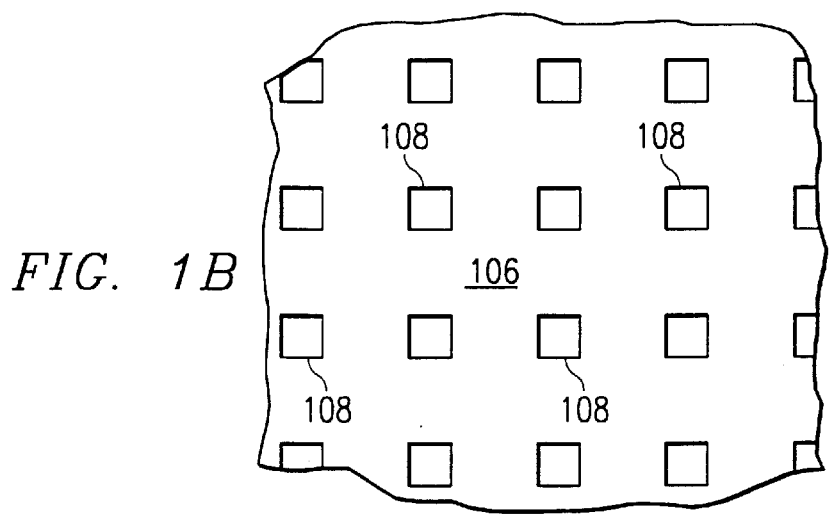
FIG. 1B shows a portion of the structure of FIG. 1A in plan view.

As best seen in FIG. 1B, cavities 108 are formed as a plurality of holes in capacitor plate 106. Cavities 108 may be square, rectangular, round, or any convenient shape. Also, cavities 108 may be arranged on a square grid as shown in FIG. 1B or may be offset with respect to each other. Cavities 108 reduce the surface area of capacitor plate 106, and so the number, size, spacing and arrangement of cavities 108 is controlled to acceptably impact the capacitance per unit area of capacitor plate 106.

Figure 2:
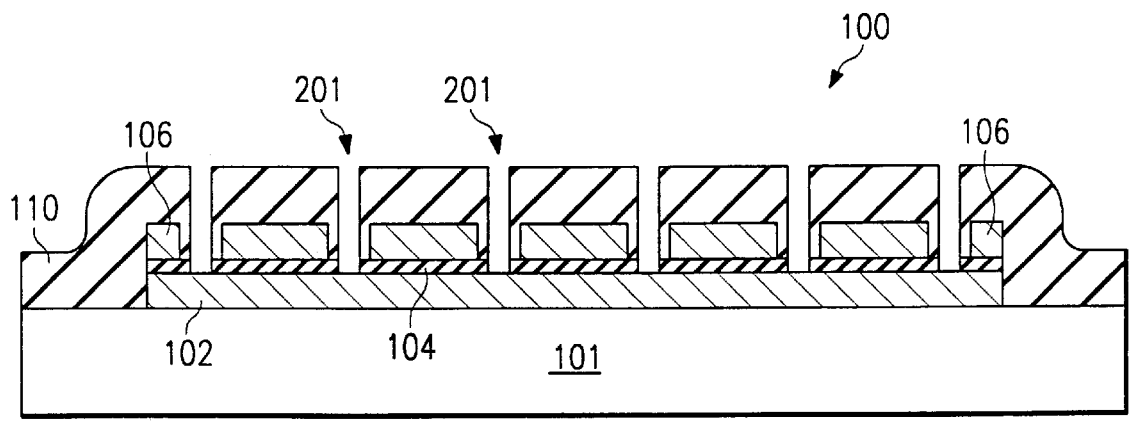
FIG. 2 illustrates the structure of FIG. 1A at a later stage in the processing.

Referring now to FIG. 2, interlayer dielectric 110 is patterned and etched to create vias 201 extending through cavities 108 to expose a portion or lower capacitor place 102. Cavities 201 are typically square or round when viewed from above, although any convenient shape may be used. The number and size of vias 201, as well as their placement, is a matter of design choice to balance lower resistivity (achieved by a greater number of vias 201) with reduced capacitance per unit area (caused by the reduction in the size of upper capacitor place 106). These factors are balanced to meet the needs of a particular application. Because interlayer dielectric 110 and capacitor dielectric 104 typically comprise a similar material such as oxide, vias 201 can be formed using conventional anisotropic etching techniques such as reactive ion etching. Regardless of the method used to form vias 201, it is important that sufficient insulating material remain between the sections of upper capacitor place 106 and the sidewalls of vias 201 to isolate posts 301 (shown in FIG. 3) from upper capacitor plate 106.

Figure 3:
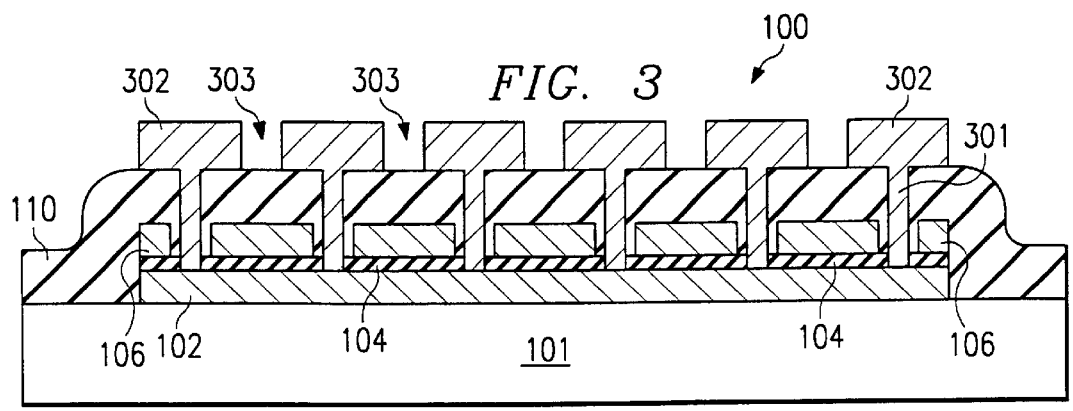
FIG. 3 illustrates in cross section the structure of FIG. 2 after a first metallization and patterning.

As shown in FIG. 3, vias 201 are filled with conductive material such as metal, polycide, or doped polysilicon. It is important to keep the resistance created by posts 301 at a minimum so the lowest resistivity processing should be used. In the particular example, posts 301 are formed during the deposition of the first metal layer used to provide interconnect wiring for the integrated circuit. Posts 301 make electrical contact to lower capacitor plate 102.

A first metal layer 302 is formed on the upper surface of interlayer dielectric 110. First metal layer 302 may comprise the same material as posts 301 or may be a different material so long as ohmic electrical contact is made between metal layer 302 and posts 301. Metal layer 302 is patterned to create openings 303 that will eventually serve as contact openings for second posts 501 (shown in FIG. 5). First metal 302 should be a low resistivity material such as aluminum, aluminum alloy or gold in accordance with the present invention although a variety of metals of low resistivity materials can be used. Preferably metal layer 302 has a resistivity of less than 1.0 Ohm per square and desirably less than 0.1 Ohm per square.

The structure shown in FIG. 3 provides a low resistance contact to lower capacitor plate 102. This contact may provide sufficient improvement in some applications that a higher resistance contact to upper plate 106 may be tolerated. In such applications, the structure of FIG. 3 may be considered a substantially complete implementation of the present invention. Metal layer 302 makes a low resistivity contact to lower capacitor plate 301 and so long as least one of capacitor plates 102 and 106 have a low resistivity contact, performance of capacitor structure 100 in accordance with the present invention will be improved. However, it is advantageous to make a low resistivity contact to both capacitor plates 102 and 104. The processing steps and structure shown in FIG. 4 and FIG. 5 illustrate the additional steps necessary to make a low resistivity contact to both capacitor plates.

Figure 4:
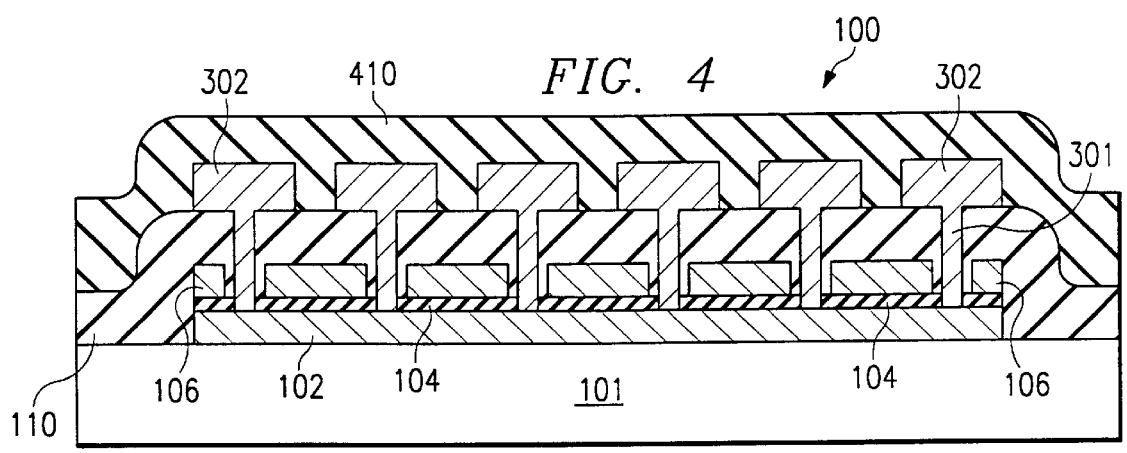
FIG. 4 illustrates in cross section the structure in accordance with the present invention after deposition of an interlayer dielectric (ILD)

In FIG. 4, first metal 302 is covered by a second interlayer dielectric 410. Second interlayer dielectric 410 fills cavities 303 formed when first metal 302 is patterned. Preferably second dielectric 410 comprises a material similar to first dielectric 110. Similarly, second dielectric 410 is planarized to provide a flat upper surface. Cavities 303 are typically square or round when viewed from above and are aligned over portions of upper capacitor plate 106. The number, placement, and size of cavities 303 are a matter of design choice to provide the desired resistance required by a particular application.

Figure 5:
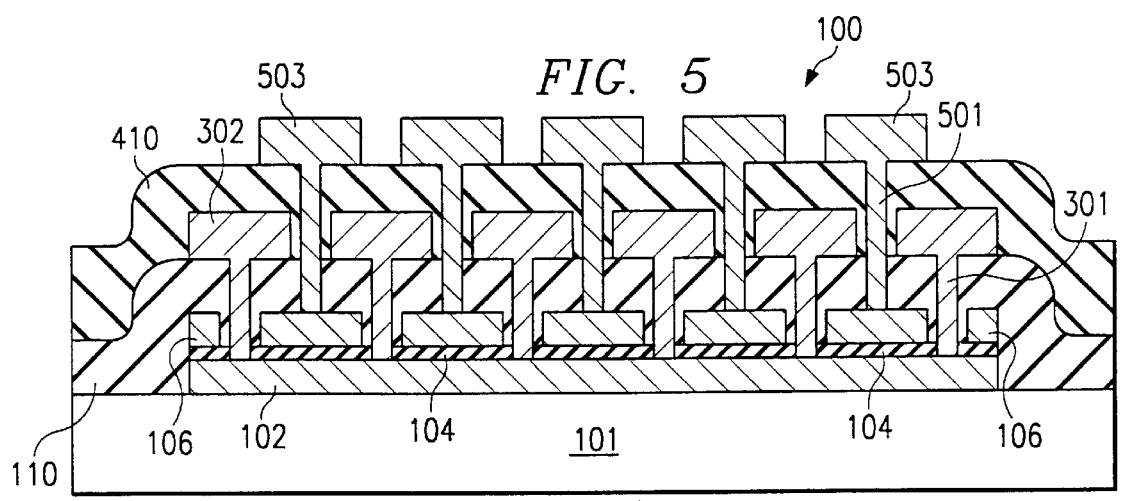
FIG. 5 illustrates in cross section a substantially completed capacitor structure in accordance with the present invention.

Referring to FIG. 5, formation of second posts 501 and patterned second metal layer 503 are accomplished using processing analogous to the formation of first posts 301 and first patterned metal layer 302. Vias are first aniostropically etched through cavities 303 (shown in FIG. 4) and the vias subsequently filled with a conductive material to form posts 501. Second metal layer 503 is formed making electrical contact to each of posts 501 and patterned to form desired interconnect structure. Second metal 503 comprises a low resistivity material as do posts 501 to minimize the resistance of capacitor structure 100 in accordance with the present invention.

An important advantage of the structure shown in FIG. 1A through FIG. 5 is that posts 301 and 501 can be arranged throughout the length and width of the capacitor at any desired density. Because a large number of posts 301 and 501 are positioned in the interior portions of capacitor structure 100 (i.e., away from the periphery as viewed from above), a great number of low resistance contacts can be made to each capacitor plate and little current flow is required within each capacitor plate 102 and 106 in order to charge capacitor structure 100. Unlike prior structures that made low resistance contact only at the capacitor periphery, the structure in accordance with the present invention will continue to achieve resistance benefits regardless of the capacitor shape or size. This feature greatly improves the ability to integrate capacitor structure 100 with other devices on an integrated circuit chip.

Figure 6:
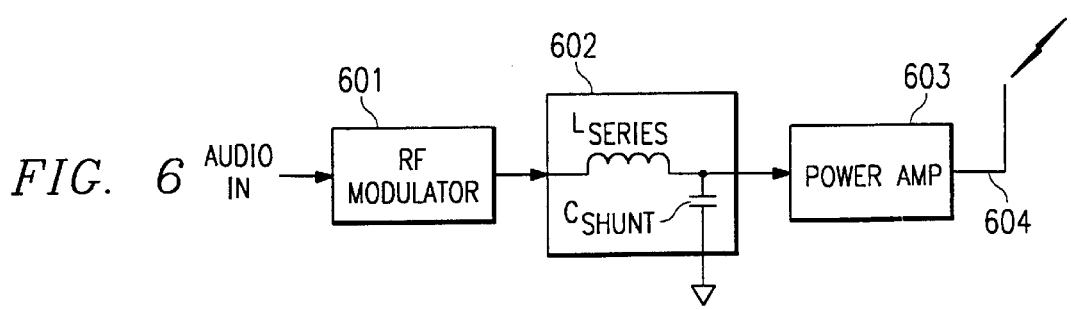
FIG. 6 shows a schematic diagram of a monolithic RF power amplifier using the capacitor structure in accordance with the present invention.

FIG. 6 illustrates a simplified power amplifier circuit using the capacitor structure 100 in accordance with the present invention. Capacitor structure 100 is used in L-section matching network 602 that may be integrated monolithically with power amplifier 603, RF modulator 601, or both. Alternatively, network 602 may be provided in a separate device. It should be understood that the circuit shown in FIG. 6 is an example only and any circuit requiring a high Q, low resistance capacitor structure can utilize capacitor structure 100 in accordance with the present invention.

Amplification in the circuit shown in FIG. 6 is accomplished by, for example, a power MOS transistor driving antenna 604. L-Section network 602 comprises a series inductor labeled $L_{SERIES}$ and a shunt capacitor labeled $C_{SHUNT}$. Network 602 couples the input of power amplifier output stage 603 to output circuitry of RF modulator 601. L-section network 602 is used to match the output impedance of modulator 601 to the input impedance of power amplifier 603 and to avoid undesirable power reflection. L-section circuit 602 includes capacitor structure 100 in accordance with the present invention to provide a high Q coupling between the preceding stage and the power amplifier 603.

Thus an improved capacitor structure and method for making an improved capacitor structure have been provided. Using multiple conductive posts throughout the area of the capacitor structure to make a low resistivity contact to first and second capacitor plates provides the resistance advantages of metal capacitors while at the same time providing the high capacitance per unit area possible with polysilicon or polycide capacitor plates. The capacitor structure in accordance with the present invention is easily integrated with other monolithic integrated circuit processing techniques and can be implemented without additional processing steps. Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for forming a capacitor comprising the steps of:

providing a substrate;

forming a first capacitor plate on the substrate;

forming a capacitor dielectric over the first capacitor plate;

forming a second capacitor plate over the first capacitor plate and separated from the first capacitor plate by the capacitor dielectric;

covering the second capacitor plate with a first dielectric;

forming a first set of vias in the first dielectric extending through the second capacitor plate to expose portions of the first capacitor plate;

filling the first set of vias with conductive posts electrically coupling to the first capacitor plate; and forming a patterned metallization electrically coupling the conductive posts to form a low resistivity coupling to the first capacitor plate.

2. The method of claim 1 further comprising the steps of:

forming a plurality of cavities extending through the second capacitor plate before covering the second capacitor plate with a first dielectric; and filling the cavities with the first dielectric.

3. The method of claim 1 further comprising:

covering the patterned metallization with a second dielectric;

forming a second set of vias, through the second dielectric to expose portions of the second capacitor plate;

filling the second set of vias with conductive posts extending through the second dielectric and electrically coupling to the second capacitor plate; and forming a patterned metallization electrically coupling the conductive posts in the second dielectric to form a low resistivity coupling to the second capacitor plate.

4. The method of claim 1 wherein the step of forming a plurality of cavities extending through the second capacitor plate comprises positioning some of the cavities in an interior portion of the second capacitor plate.

5. The method of claim 1 wherein the first and second capacitor plates comprise polysilicon silicide.

* * * * *